(12) United States Patent
Park

(10) Patent No.: US 7,193,283 B2
(45) Date of Patent: Mar. 20, 2007

(54) FLASH CELL USING A PIEZOELECTRIC EFFECT

(75) Inventor: Sung Kun Park, Cheongju-si (KR)

(73) Assignee: Magnachip Semiconductor Ltd., ChungCheong Buk-do (KR)

( * ) Notice: Subject to any disclaimer, the term of this patent is extended or adjusted under 35 U.S.C. 154(b) by 26 days.

(21) Appl. No.: 11/160,332

(22) Filed: Jun. 20, 2005

(65) Prior Publication Data

US 2006/0284239 A1    Dec. 21, 2006

(51) Int. Cl.
*H01L 29/84* (2006.01)
(52) U.S. Cl. .............................. 257/415; 257/E27.006
(58) Field of Classification Search ................ 257/415, 257/E27.006
See application file for complete search history.

(56) References Cited

U.S. PATENT DOCUMENTS

| | | | | |
|---|---|---|---|---|
| 4,589,009 | A | * 5/1986 | Motamedi | .................. 257/254 |
| 5,831,299 | A | * 11/1998 | Yokoyama et al. | ......... 257/295 |
| 6,146,949 | A | 11/2000 | Wu | ............................ 438/275 |
| 6,232,180 | B1 | 5/2001 | Chen | .......................... 438/257 |
| 6,858,444 | B2 | * 2/2005 | Ahn et al. | ..................... 438/3 |

* cited by examiner

*Primary Examiner*—Ngân V. Ngô
(74) *Attorney, Agent, or Firm*—Marshall, Gerstein & Borun LLP

(57) ABSTRACT

The flash cell includes a silicon substrate; a floating gate formed on a predetermined area of the silicon substrate; a control gate formed on the floating gate and the silicon substrate; a piezoelectric layer formed on the control gate; and an upper electrode formed on the piezoelectric layer. The flash cell brings the control gate in contact with the floating gate, instead of electrically removing electrons contained in the floating gate, resulting in a charge equilibrium state. Therefore, the flash cell completely solves the over-erasing problem. If a voltage signal is applied to the flash cell, the flash cell uses the displacement of piezoelectric/electrostrictive materials. The displacement occurs according to the received voltage, such that the flash cell implements at high speed compared to conventional electric erasing methods.

8 Claims, 1 Drawing Sheet

FLASH CELL USING A PIEZOELECTRIC EFFECT

FIELD OF THE INVENTION

The present invention relates to a semiconductor process, and more particularly to a flash cell using a piezoelectric effect.

DESCRIPTION OF THE RELATED ART

Generally, a flash memory simultaneously erases data stored in all flash cell blocks using a single erasing process, differently from an EEPROM (Electrically Erasable Programmable Read-Only Memory). The time consumed for performing the erasing process once, i.e., a data erasing time per unit bit, of the flash memory is less than that of the EEPROM.

However, if the size of the memory block to be erased during a single erasing process is quite large, irregular data erasing speed inevitably occurs, such that the amount of over-erasing occurrences is gradually increased.

In order to solve the above-mentioned over-erasing problem, there have been proposed a method for reducing the interval between erasing pulses and a method for dividing a sector into a plurality of sections, however, the overall erasing time is inevitably increased although the above-mentioned methods are used.

For another example, an additional circuit or a test vector can be adapted to prevent the over-erasing problem from being generated, or a charging pump can be used to perform the data erasing operation. However, the above-mentioned methods inevitably increase the chip area and test time, such that it is difficult to improve erase uniformity.

FIG. 1 shows a graph illustrating a flash cell problem according to a conventional art as disclosed in Proceedings of the IEEE, April 2003, Vol. 91, pp. 489~502, which is incorporated herein by reference. In more detail, FIG. 1 shows the distribution of a threshold voltage of a 1 Mb flash array after performing the UV erase-, the CHE (Channel hot Electron) programming-, and the FN (Fowler-Nordheim) erase operations. The elliptical circle denoted by dotted lines in FIG. 1 shows a tail bit formed during an electrical FN erase process.

Referring to FIG. 1, if an electrical erase process is performed according to the conventional art, an erase threshold voltage Vt includes a tail bit. The higher the number of the program erasing operations, the greater the influence of the tail bit.

If the UV erase operation is performed as shown in FIG. 1, the erase threshold voltage Vt is very uniform, but it is impossible to perform a byte-unit erase operation as in an EEPROM, and it is also impossible to perform a sector/block erase operation as in the flash cell. In other words, a selective erase operation is impossible, and all data stored in a chip must be simultaneously deleted.

SUMMARY OF THE INVENTION

Therefore, the present invention has been made in view of the above problems, and it is an object of the present invention to provide a flash cell using the piezoelectric effect, which balances a floating gate to be grounded to a control gate, and thus controls electrons of the floating gate.

It is another object of the present invention to provide a flash cell using the piezoelectric effect, which has a sufficiently-low initial threshold voltage (Vt) to implement initial threshold voltage (Vt) associated with an erasing state.

It is yet another object of the present invention to provide a flash cell using the piezoelectric effect, which installs a piezoelectric material onto a control gate, and then installs a metal electrode onto the piezoelectric material.

It is yet another object of the present invention to provide a flash cell using the piezoelectric effect, in which an oxide layer is deposited between a floating gate and a control gate until forming the control gate, and is then removed by a wet etching method, resulting in the creation of an air gap.

In accordance with the present invention, the above and other objects can be accomplished by a flash cell using the piezoelectric effect, comprising: a silicon substrate; a floating gate formed on a predetermined area of the silicon substrate; a control gate formed on the floating gate and the silicon substrate; a piezoelectric layer formed on the control gate; and an upper electrode formed on the piezoelectric layer.

BRIEF DESCRIPTION OF THE DRAWINGS

The above and other objects, features and other advantages of the present invention will be more clearly understood from the following detailed description taken in conjunction with the accompanying drawings, in which.

DESCRIPTION OF THE PREFERRED EMBODIMENTS

Figure 1:
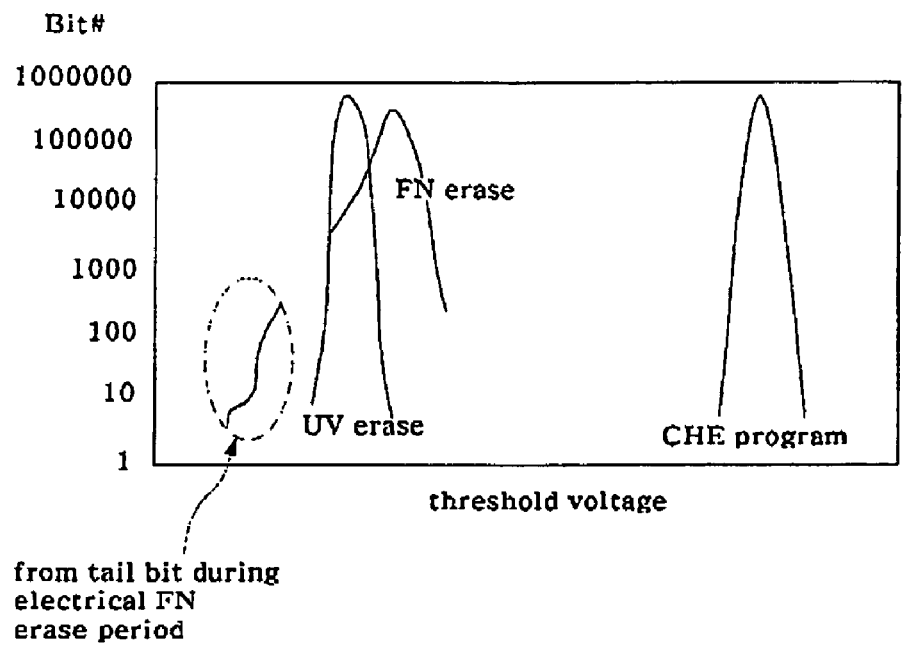
FIG. 1 shows a graph illustrating a flash cell problem according to a conventional art.

Now, preferred embodiments of the present invention will be described in detail with reference to the annexed drawings. In the drawings, the same or similar elements are denoted by the same reference numerals even though they are depicted in different drawings. In the following description, a detailed description of known functions and configurations incorporated herein will be omitted when it may make the subject matter of the present invention rather unclear.

Figure 2:
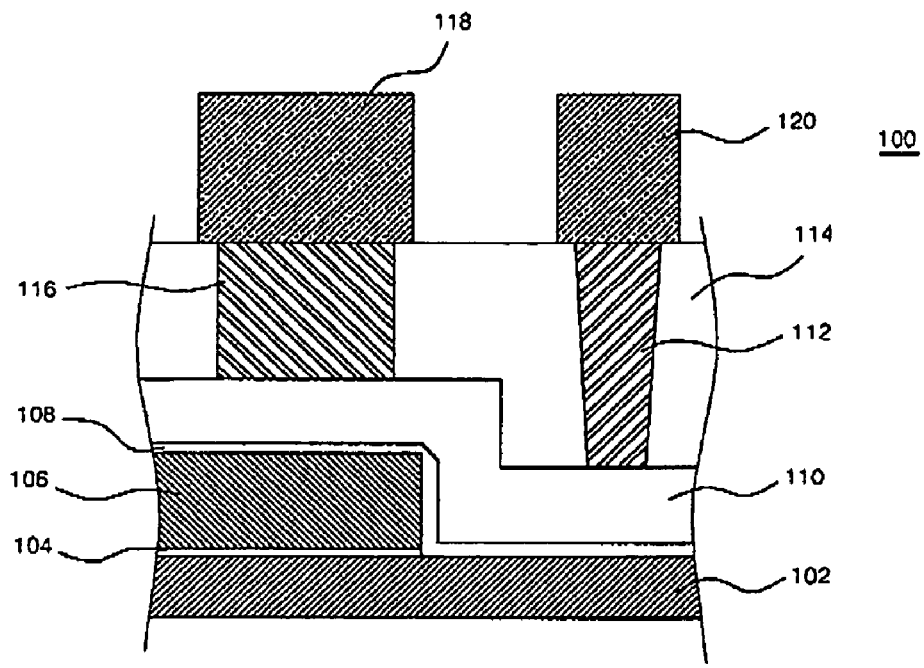
FIG. 2 is a cross-sectional view illustrating a flash cell using the piezoelectric effect in accordance with a preferred embodiment of the present invention.

FIG. 2 is a cross-sectional view illustrating a flash cell using the piezoelectric effect in accordance with a preferred embodiment of the present invention.

As shown in FIG. 2, a flash cell 100 using the piezoelectric effect according to the present invention includes a silicon substrate 102, a tunnel oxide layer 104 formed on the silicon substrate 102, a floating gate 106 formed on a predetermined area of the tunnel oxide layer 104, a control gate 110 formed of polysilicon simultaneously with being deposited on the floating gate 106 and the tunnel oxide layer 104, an interlayer insulating layer 114 formed on the control gate 110, and first and second metal layers 118 and 120 formed on the interlayer insulating layer 114 simultaneously while being patterned in predetermined shapes.

The flash cell 100 using the piezoelectric effect includes an air gap 108 between the control gate 110 formed of polysilicon and the floating gate 106. The flash cell 100 further includes a piezoelectric layer 116 positioned under the first metal layer 118 and a contact 112 for connecting the second metal layer 120 to the control gate 110. The piezoelectric layer 116 is formed to pass through the interlayer insulating layer 114 such that it is electrically connected to the floating gate 106 via the control gate 110.

The flash cell 100 using the piezoelectric effect is programmed by the same method as the conventional flash cell. In this case, if the floating gate 106 of the programmed flash cell is filled with electrons, a threshold voltage Vt is increased.

In order to perform the erasing operation, voltage is applied to the first metal layer 118 and the control gate 110 which are connected to the desired block to be erased.

In accordance with a preferred embodiment of the present invention, the control gate 110 acts as a lower electrode of the piezoelectric layer 116, and the first metal layer 118 acts as an upper electrode. If a current signal is applied to the control gate 110 and the first metal layer 118, the control gate 110 connected to a ground terminal is brought into contact with the floating gate 106 due to the piezoelectric effect, such that electrons contained in the floating gate 106 are removed.

As stated above, the method according to the present invention allows the control gate electrically grounded by the piezoelectric effect to be in contact with the floating gate, and removes electrons accumulated in the floating gate, such that it can delete all data stored in the flash cell. The above-mentioned inventive method can be equally applied to the flash cell and the EEPROM by adjusting a connection range of the piezoelectric layer.

Although the present invention exemplarily discloses that a high threshold voltage Vt is indicative of a program state, and a low threshold voltage Vt is indicative of an erasing state (i.e., a Vt initial state), it should be noted that the low threshold voltage Vt may also be indicative of the program state, and the high threshold voltage Vt may also be indicative of the erasing state as necessary.

In the case of programming a flash cell structure disclosed in the preferred embodiment of the present invention, a high-temperature carrier implantation method is structurally superior to an FN tunneling method, but it should be noted that the above-mentioned flash cell structure can also be applied to both the high-temperature carrier implantation method and the FN tunneling method as necessary.

The flash cell according to the present invention can also be applied to a 1-poly EEPROM by allowing the floating gate to be in contact with the silicon substrate.

Although the present invention discloses the piezoelectric material using a general PZT (Piezoelectric), it should be noted that all materials having a sufficient electrostrictive effect can be applied to the present invention.

Also, the present invention can be applied to a specific structure in which a stack via is formed on an upper electrode to indicate the electrostrictive effect, such that the specific structure can endure sufficient structural stress.

As apparent from the above description, the present invention brings the control gate in contact with the floating gate, instead of electrically removing electrons contained in the floating gate, resulting in a charge equilibrium state. As a result, the present invention completely solves the over-erasing problem.

If a voltage signal is applied to the flash cell of the present invention, the present invention uses displacement of piezoelectric/electrostrictive materials. In this case, the displacement occurs according to the applied voltage, such that the present invention implements a very high speed as compared to the conventional electric erasing method.

The present invention can be equally applied to the flash cell and the EEPROM by adjusting a connection range of the piezoelectric material, and an area in the present invention is superior to that in a conventional method capable of distinguishing an erasing unit using a well.

Further, the present invention deposits an electrostrictive material on the floating poly in the case of a 1-poly Non Volatile Memory (NVM), such that it can perform a ground erasing method by bringing the floating poly in contact with the silicon substrate.

Although the preferred embodiments of the present invention have been disclosed for illustrative purposes, those skilled in the art will appreciate that various modifications, additions and substitutions are possible, without departing from the scope and spirit of the invention as disclosed in the accompanying claims.

What is claimed as new and desired to be protected by Letters Patent of the United States is:

1. A flash cell using piezoelectric effect, comprising:
   a silicon substrate;
   a floating gate formed over a predetermined area of the silicon substrate;
   a control gate formed over the floating gate and the silicon substrate;
   a piezoelectric layer formed on the control gate; and
   an upper electrode formed on the piezoelectric layer.

2. The flash cell according to claim 1, wherein the flash cell uses an initial threshold voltage state as an erasing state, such that it prevents an over-erasing problem from being generated.

3. The flash cell according to claim 1, wherein the control gate is physically brought into contact with the floating gate, and implements a charge equilibrium state, such that the flash cell is erased.

4. The flash cell according to claim 1, wherein the flash cell forms an air gap between the control gate and the floating gate, such that the control gate is movable.

5. The flash cell according to claim 1, wherein the control gate is used as a lower electrode such that the control gate can be physically driven.

6. The flash cell according to claim 1, wherein:
   a connection range of the piezoelectric layer is adjusted such that the flash cell is applicable to other semiconductor devices.

7. The flash cell according to claim 6, wherein:
   if the semiconductor device is a 1-poly BEPROM (Electrically Erasable Programmable Read-Only Memory), the floating gate is brought into contact with the silicon substrate.

8. The flash cell according to claim 1, wherein the piezoelectric layer is formed of a PZT (Piezoelectric) material.

* * * * *

UNITED STATES PATENT AND TRADEMARK OFFICE
CERTIFICATE OF CORRECTION

PATENT NO. : 7,193,283 B2  Page 1 of 1
APPLICATION NO. : 11/160332
DATED : March 20, 2007
INVENTOR(S) : Sung K. Park It is certified that error appears in the above-identified patent and that said Letters Patent is hereby corrected as shown below:

On the Title Page:

At field (73), "Magnachip Semiconductor Ltd." should be -- Magnachip Semiconductor, Ltd. --.

In the Claims:

At Column 4, line 50, "BEPROM" should be -- EEPROM --.

Signed and Sealed this
Fourteenth Day of June, 2011

David J. Kappos
*Director of the United States Patent and Trademark Office*